United States Patent
Gouchi

(10) Patent No.: US 9,974,165 B2
(45) Date of Patent: May 15, 2018

(54) ELECTRONIC COMPONENT-EMBEDDED MODULE AND COMMUNICATION TERMINAL DEVICE

(71) Applicant: Murata Manufacturing Co., Ltd., Kyoto (JP)

(72) Inventor: Naoki Gouchi, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days. days.

(21) Appl. No.: 15/418,918

(22) Filed: Jan. 30, 2017

(65) Prior Publication Data
US 2017/0171966 A1  Jun. 15, 2017

Related U.S. Application Data

(60) Division of application No. 14/577,333, filed on Dec. 19, 2014, now Pat. No. 9,596,764, which is a (Continued)

(30) Foreign Application Priority Data

Oct. 5, 2012  (JP) .................................. 2012-223384

(51) Int. Cl.
*H05K 1/11* (2006.01)
*H05K 1/18* (2006.01)
(Continued)

(52) U.S. Cl.
CPC ......... *H05K 1/0287* (2013.01); *H05K 1/0292* (2013.01); *H05K 1/0293* (2013.01);
(Continued)

(58) Field of Classification Search
CPC .... H05K 1/0287; H05K 3/4007; H05K 1/111; H05K 1/0292; H05K 3/4092; H05K 1/0293; H05K 3/24
See application file for complete search history.

(56) References Cited

U.S. PATENT DOCUMENTS 6,175,157 B1 * 1/2001 Morifuji ............... H01L 21/563
257/685
6,462,420 B2 10/2002 Hikita et al.
(Continued)

FOREIGN PATENT DOCUMENTS

JP  2008-042904 A  2/2008
JP  2009-260318 A  11/2009

OTHER PUBLICATIONS

International Search Report issued in Application No. PCT/JP2013/072707 dated Oct. 1, 2013.
Written Opinion issued in Application No. PCT/JP2013/072707 dated Oct. 1, 2013.

*Primary Examiner* — Ishwarbhai B Patel
(74) *Attorney, Agent, or Firm* — Pearne & Gordon LLP

(57) ABSTRACT

To prevent decrease of the bonding strength of an electronic component and a multilayer substrate, an electronic component-embedded module may include an electronic component having a plurality of pads and a multilayer substrate which includes a plurality of resin layers and a cavity for containing the electronic component. The multilayer substrate may include a first resin layer having a plurality of first pattern conductors and a space, and a second resin layer having a second pattern conductor and a plurality of third pattern conductors. The plurality of third pattern conductors may be in conduction with either of the first pattern conductors or the pads, with the second resin layer being placed over the first resin layer. The second pattern conductor may be arranged around a first pad with a gap, and the second resin layer is present between the second pattern conductor and at least one of the first pads.

6 Claims, 19 Drawing Sheets

Related U.S. Application Data continuation of application No. PCT/JP2013/072707, filed on Aug. 26, 2013.

(51) Int. Cl.
  *H05K 1/02* (2006.01)
  *H05K 3/40* (2006.01)
  *H05K 3/24* (2006.01)

(52) U.S. Cl.
  CPC ............ *H05K 1/111* (2013.01); *H05K 1/185* (2013.01); *H05K 3/24* (2013.01); *H05K 3/4007* (2013.01); *H05K 3/4092* (2013.01); *H05K 1/183* (2013.01); *H05K 2201/096* (2013.01); *H05K 2201/09509* (2013.01)

(56) References Cited

U.S. PATENT DOCUMENTS

| | | |
|---|---|---|
| 7,091,593 B2 | 8/2006 | Ishimaru et al. |
| 2005/0211465 A1 | 9/2005 | Sunohara et al. |
| 2010/0300737 A1 | 12/2010 | Sato et al. |
| 2010/0300740 A1* | 12/2010 | Ichiyanagi ............ H01G 4/232 174/260 |
| 2011/0057305 A1* | 3/2011 | Chia ................... H01L 23/3171 257/700 |
| 2011/0121445 A1 | 5/2011 | Mori et al. |
| 2012/0188734 A1* | 7/2012 | Mikado ................. H05K 1/185 361/761 |

* cited by examiner

F I G. 3
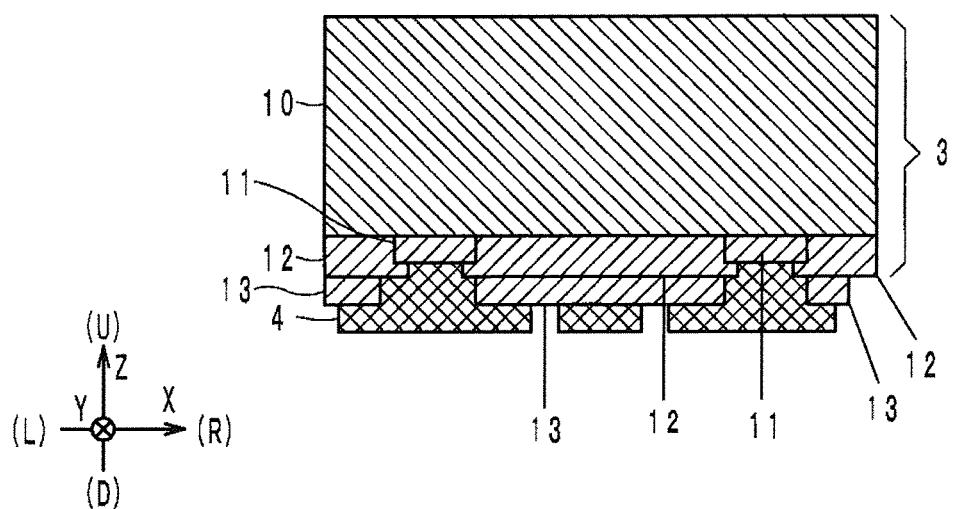

F I G . 4 A
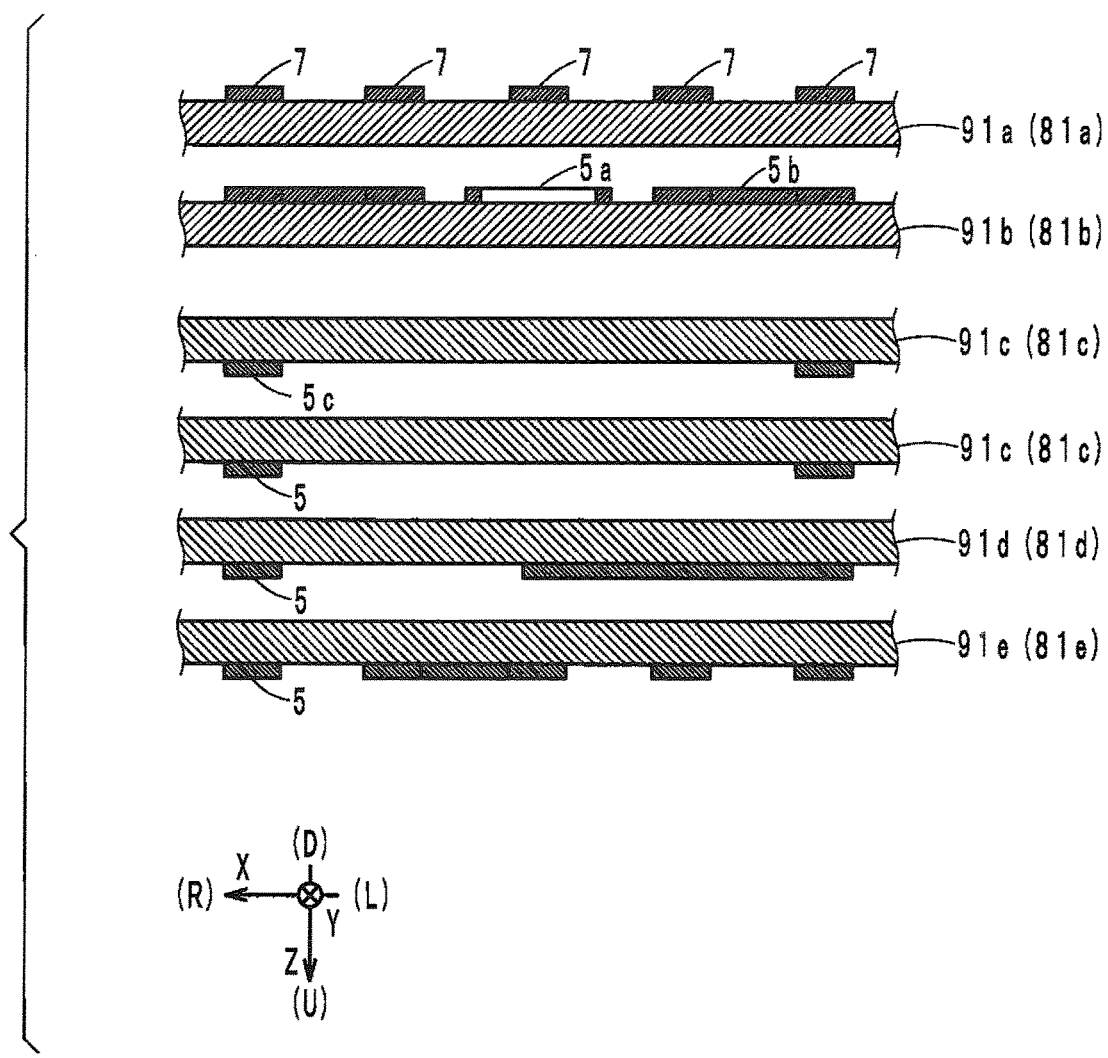

F I G . 4 B
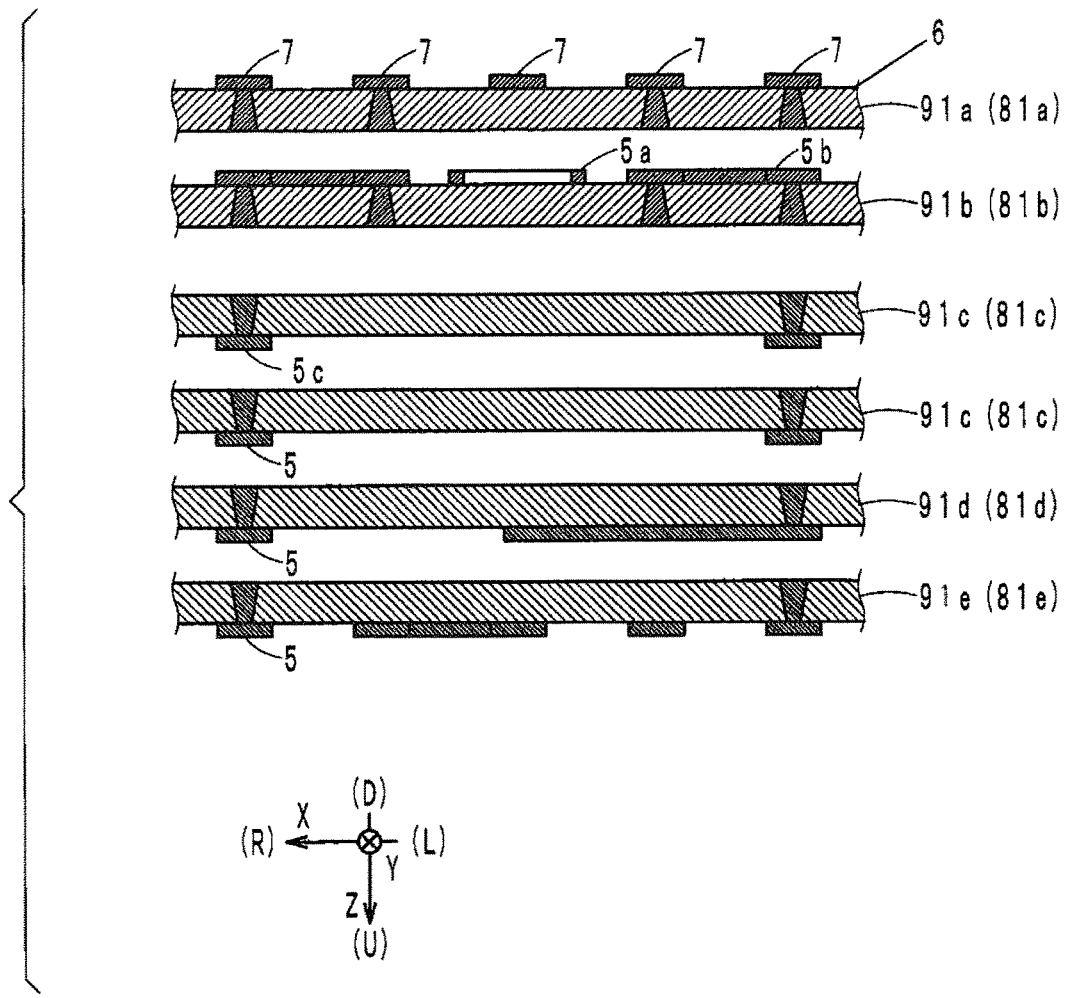

F I G . 4 D
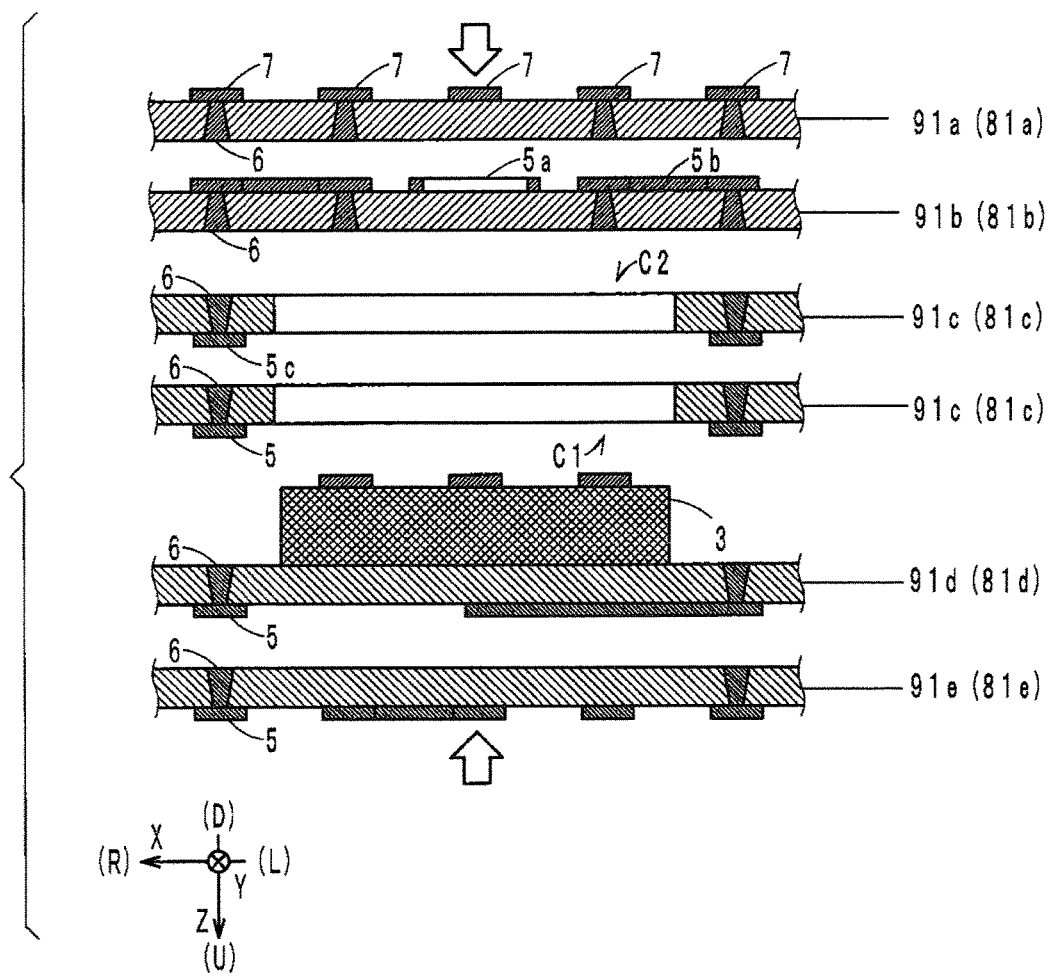

F I G. 6 A
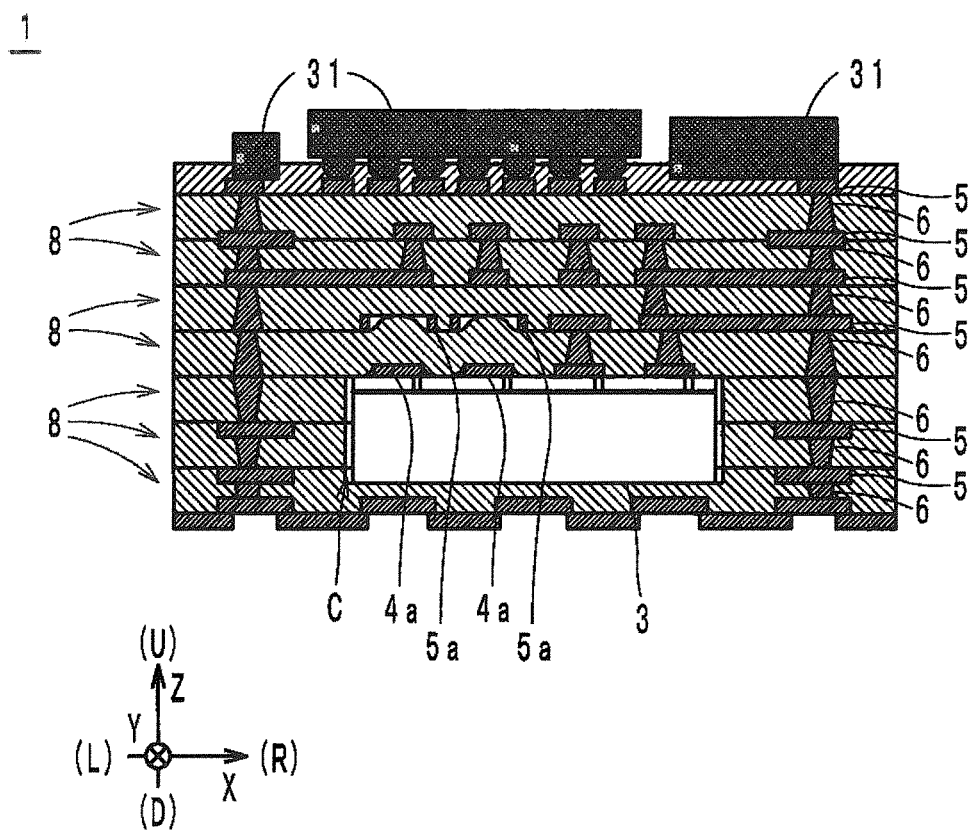

F I G . 8
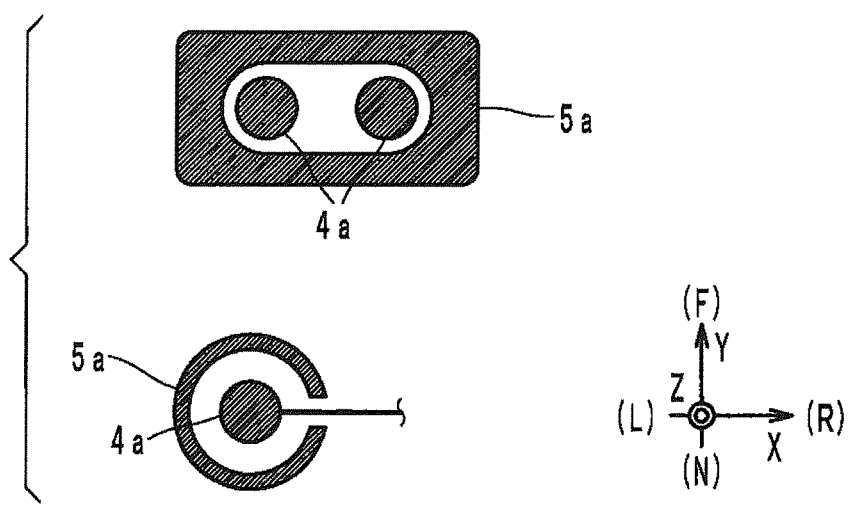

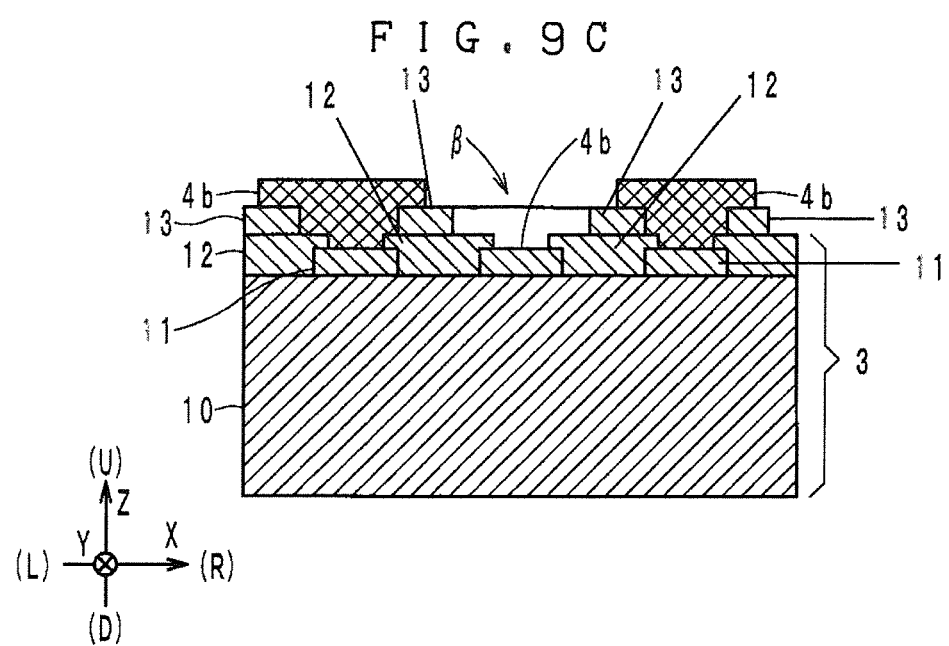

ELECTRONIC COMPONENT-EMBEDDED MODULE AND COMMUNICATION TERMINAL DEVICE

This is a divisional of U.S. application Ser. No. 14/577,333 filed on Dec. 19, 2014, which is a continuation of PCT/JP2013/072707 filed on Aug. 26, 2013, which claims priority from Japanese Patent Application No. 2012-223384 filed on Oct. 5, 2012, the contents of each of which are incorporated herein by reference in their entireties.

BACKGROUND OF THE INVENTION

1. Field of the Invention

The present invention relates to electronic component-embedded modules in which an electronic component is embedded in a multilayer substrate and communication terminal devices including the same.

2. Description of Related Art

One of conventional electronic component-embedded modules is a component-embedded wiring substrate (hereinafter, simply referred to as "wiring substrate") disclosed in Japanese Patent Laid-Open Publication No. 2009-260318. The wiring substrate includes a core substrate in the shape of a generally rectangular plate. The principal surface of the core substrate (hereinafter, referred to as "core principal surface") has a principal surface side buildup layer, and the other surface of the core substrate which is opposite to the principal surface (hereinafter, referred to as "core opposite surface") has a rear surface side buildup layer.

The core substrate has a container hole (i.e., cavity) that is a through hole which has a rectangular shape when viewed in plan from the top. In the container hole, an IC chip (semiconductor integrated circuit element), which is an example of the electronic component, is contained. Note that the gap between the container hole and the IC chip is filled with a resin filler, whereby the IC chip is secured to the core substrate.

The principal surface side buildup layer has a configuration formed by alternately stacking up three principal surface side interlayer resin layers which are made of a thermosetting resin and principal surface side conductor layers which are made of copper. Further, the first via conductors formed by copper plating are provided inside respective one of the principal surface side interlayer resin layers. Some of these first via conductors are connected to the IC chip.

Another example of the electronic component-embedded modules is a Si base package disclosed in Japanese Patent Laid-Open Publication No. 2008-42904. The Si base package has, in its own lower part, an interposer (i.e., multilayer substrate) which has an etched cavity for a Radio Frequency Integrated Circuit (RFIC) chip that is another example of the electronic component. The cavity is provided with a metal cover for enhancement of the shielding property. The RFIC chip is flip-chip joined to an additional portion of the Si base package using microbumps.

SUMMARY OF THE INVENTION

Problems to be Solved by the Invention

In recent years, along with decrease in size of the electronic component-embedded modules and improvements of their functions, the size of the bonding portion between the electronic component and the multilayer substrate has been decreasing. However, even when the size of the bonding portion is decreased, preventing the decrease of the bonding strength is demanded.

In view of the above circumstances, an object of the present invention is to provide electronic component-embedded modules and communication terminal devices in which the decrease of the bonding strength between the electronic component and the multilayer substrate can be prevented.

Solution to Problems

To achieve the above object, one aspect of the present invention may include an electronic component-embedded module including; an electronic component having a plurality of pads on its surface; and a multilayer substrate which is a multilayer body formed by stacking up a plurality of resin layers and in which a cavity may be formed for containing the electronic component.

The plurality of resin layers of the multilayer substrate at least may include a first resin layer at which a plurality of first pattern conductors and a space, which forms the cavity, may be formed, and a second resin layer having at least one second pattern conductor and a plurality of third pattern conductors, the plurality of third pattern conductors being capable of having electrical conduction with either of the plurality of first pattern conductors or the plurality of pads, the second resin layer being placed over the first resin layer.

The second pattern conductor may be arranged around a first pad with a gap provided between the second pattern conductor and the first pad when viewed in plan in a layer stacking direction of the first resin layer and the second resin layer, the first pad being at least one of the plurality of pads, and the second resin layer may be present between the second pattern conductor and the first pad.

The second aspect of the present invention may include an electronic component-embedded module including; an electronic component having a plurality of pads on its surface; and a multilayer substrate which is a multilayer body formed by stacking up a plurality of resin layers and in which a cavity may be formed for containing the electronic component.

The plurality of resin layers of the multilayer substrate at least may include a first resin layer at which a plurality of first pattern conductors and a space, which forms the cavity, may be formed, and a second resin layer having at least one second pattern conductor and a plurality of third pattern conductors, the plurality of third pattern conductors being capable of having electrical conduction with either of the plurality of first pattern conductors or the plurality of pads, the second resin layer being placed over the first resin layer.

The plurality of pads may include a first pad arranged around the second pattern conductor with a gap provided between the first pad and the second pattern conductor when viewed in plan in a layer stacking direction of the first resin layer and the second resin layer, and the second resin layer may be present between the second pattern conductor and the first pad.

BRIEF DESCRIPTION OF THE DRAWINGS

FIG. 3 is a schematic diagram showing details of a configuration of the electronic component of FIG. 1.

FIG. 4A is a schematic diagram illustrating a first process in a manufacturing method of the module of FIG. 1.

FIG. 4B is a schematic diagram illustrating a process following the first process of FIG. 4A.

FIG. 4D is a schematic diagram illustrating a process following the process of FIG. 4C.

FIG. 6A is a vertical cross-sectional view of an electronic component-embedded module according to a variation.

FIG. 8 is the second diagram showing other configuration examples of the first pad of FIG. 5A and the second pattern conductor of FIG. 5B.

FIG. 9C is a diagram showing the second example of the configuration of the recess shown in FIG. 9A.

DETAILED DESCRIPTION OF THE PREFERRED EMBODIMENTS (Preliminary)

As a preliminary, the X-axis, Y-axis, and Z-axis shown in some of the drawings are described. The X-axis, Y-axis, and Z-axis are perpendicular to one another. The Z-axis represents the layer stacking direction of resin layers. For the convenience of illustration, the negative direction side of the Z-axis may be referred to as "downside (D)", and the positive direction side of the Z-axis may be referred to as "upside (U)". The X-axis may represent the left-and-right direction. Particularly, the positive direction side of the X-axis may be referred to as "right side (R)", and the negative direction side of the X-axis may be referred to as "left side (L)". The Y-axis may represent the front-and-rear direction. Particularly, the positive direction side of the Y-axis may be referred to as "far side (F)", and the negative direction side of the Y-axis may be referred to as "near side (N)".

(First Embodiment)

Figure 1:
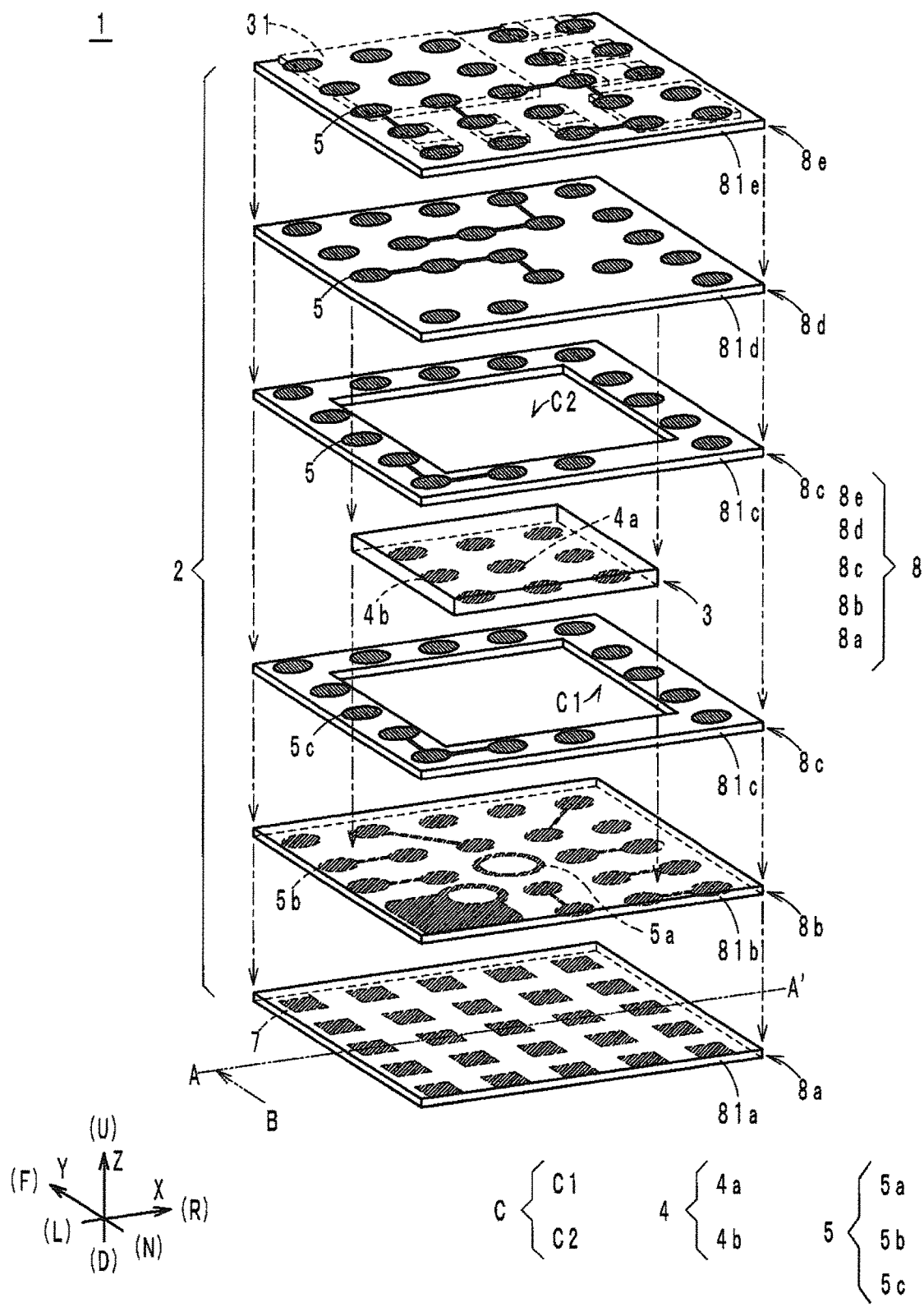
FIG. 1 is an exploded perspective view of an electronic component-embedded module according to the first embodiment.
Figure 2:
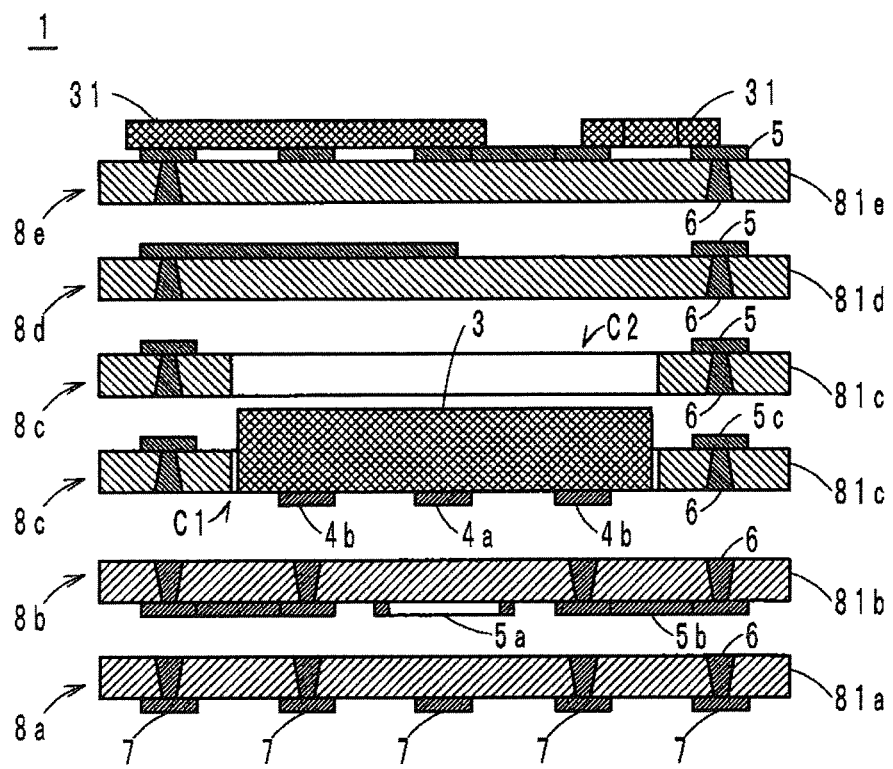
FIG. 2 is a vertical cross-sectional view taken along line A-A' of FIG. 1, which is viewed in the direction of arrow B.
Figure 2:
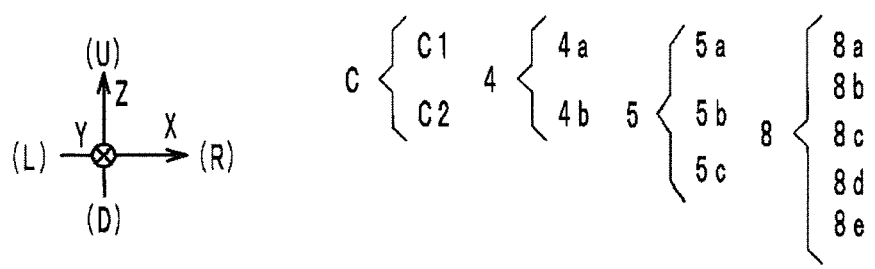

FIG. 1 is an exploded perspective view of an electronic component-embedded module (hereinafter, simply referred to as "module") 1 according to the first embodiment of the present invention. FIG. 2 is a vertical cross-sectional view taken along line A-A' of FIG. 1 (hereinafter, referred to as "vertical center plane"), which is viewed in the direction of arrow B.

In FIG. 1 and FIG. 2, the module 1 may be configured so as to be mountable onto a not shown mother substrate. This module 1 may include a multilayer substrate 2, at least one electronic component 3, a plurality of pads 4 (a first pad 4a and a second pad 4b are shown), a plurality of pattern conductors 5 (a first pattern conductor 5c, a second pattern conductor 5a and a third pattern conductors 5b are shown), a plurality of via conductors 6, and a plurality of external electrodes 7. This module 1 may also include a plurality of surface mount type electronic components 31 as additional elements.

The multilayer substrate 2 is a multilayer body formed by stacking up a plurality of resin layers 8 (layers 8a to 8e are shown) and is deformable by external force. In the multilayer substrate 2, the plurality of resin layers 8 includes at least one first resin layer 8c (two first resin layers 8c are shown), a second resin layer 8b, a third resin layer 8a for joining to the mother substrate (not shown), a fourth resin layer 8d, and a fifth resin layer 8e.

The layers 8a to 8e may include resin sheets 81a to 81e which may consist of an electrically insulative flexible material (e.g., thermoplastic resins such as polyimide and liquid crystal polymer). The liquid crystal polymer may have excellent high frequency characteristics and low water absorbency and may therefore be preferred as the material of the resin sheets 81a to 81e. The layers 8a to 8e may include identical rectangular shapes when viewed in plan from the top. The thickness of each of the layers 8a to 8e may range from about 10 to about 100 μm.

When the module 1 is mounted to a mother substrate, the third resin layer 8a may be the closest to the mother substrate among the plurality of resin layers 8. On the lower surface of the resin sheet 81a of the third resin layer 8a, a plurality of external electrodes 7 which may consist of an electrically-conductive material, such as copper, may be provided so as to correspond to the positions of land electrodes provided on the mother substrate. Note that, in FIG. 1, for the sake of clarity of the drawing, only one of the external electrodes is designated by reference numeral "7".

In the resin sheet 81a, a plurality of via conductors 6 may be provided as shown in FIG. 2. Note that, in FIG. 1, the via conductors 6 may not shown for the sake of clarity of the drawing. The via conductors 6 may consist of an electrically-conductive material, such as an alloy of tin and silver, for example. The via conductors 6 may be used for electrically coupling the electronic components 3, 31 to the land electrodes of the mother substrate. The via conductors 6 may be provided immediately above predetermined external electrodes 7 so as to vertically penetrate through the resin sheet 81a.

The second resin layer 8b may be placed over the upper surface of the third resin layer 8a. On the lower surface of the resin sheet 81b of the second resin layer 8b, a plurality of pattern conductors 5 may be provided which may be consist of an electrically-conductive material, such as copper. As the plurality of pattern conductors 5, at least a second pattern conductor 5a and a third pattern conductors 5b may be provided on the lower surface of the resin sheet 81b. The second pattern conductor 5a may be arranged around a first pad 4a (described later) with a gap provided between the second pattern conductor 5a and the first pad 4a when viewed in plan in the layer stacking direction of the second resin layer 8b and the first resin layers 8c (Z-axis direction). The third pattern conductors 5b may be provided at positions different from the second pattern conductor 5a when viewed in plan in the layer stacking direction. The third pattern conductors 5b may be used for electrically coupling to second pads 4b (described later) of the electronic component 3, the pattern conductors 5 of the first resin layers 8c, and the like, via at least one via conductor 6.

In the resin sheet 81b, via conductors 6 may also be provided which are the same as those described above. The via conductors 6 may be provided immediately above predetermined third pattern conductors 5b so as to vertically penetrate through the resin sheet 81b.

On the upper surface of each of the first resin layers 8c, first pattern conductors 5c may be provided as the plurality of pattern conductors 5 for electrically coupling the electronic components 31 to the land electrodes.

In the resin sheet 81c of each of the first resin layers 8c, via conductors 6 may also be provided which are the same as those described above. The via conductors 6 may be provided immediately below the first pattern conductors 5c provided on the resin sheet 81c so as to vertically penetrate through the resin sheet 81c. Note that, in FIG. 1 and FIG. 2, for the sake of clarity of the drawings, only one of the first pattern conductors 5c for each of the first resin layers 8c is designated by reference numeral "5c". Likewise, in FIG. 2, only one of the via conductors 6 for each of the first resin layers 8c is designated by reference numeral "6". In this respect, the same may apply to the other layers 8d, 8e.

Here, in the present embodiment, the multilayer substrate 2 may include two first resin layers 8c. In this case, the lower first resin layer 8c may be placed over the upper surface of the second resin layer 8b, and the upper first resin layer 8c may be placed over the upper surface of the lower first resin layers 8c.

Inside the multilayer substrate 2, specifically in the two first resin layers 8c, a cavity C (through holes C1 and C2 are shown) may be provided for containing the electronic component 3 which will be described later. Specifically, at the same position (e.g., generally at the center) of the first resin layers 8c, through holes C1, C2 may be provided, with through holes C1, C2 may have generally the same shape as the electronic component 3 (e.g., rectangular shape) when viewed in plan from the top. The through holes C1, C2 may be an example of the space that forms the cavity C. The cavity C may include these through holes C1, C2.

The fourth resin layer 8d may be placed over the upper surface of the upper first resin layer 8c so as to close the opening of the cavity C. On the upper surface of the resin sheet 81d of the fourth resin layer 8d, a plurality of pattern conductors 5 may be provided for electrically coupling the electronic components 31 to the land electrodes. In the resin sheet 81d, a plurality of via conductors 6 may also be provided. The plurality of via conductors 6 may be provided immediately below the pattern conductors 5 provided on the resin sheet 81d so as to vertically penetrate through the resin sheet 81d.

The fifth resin layer 8e may be placed over the upper surface of the fourth resin layer 8d. On the upper surface of the resin sheet 81e of the fifth resin layer 8e, land electrodes for use in mounting of the electronic components 31 may be provided as the plurality of pattern conductors 5. In the resin sheet 81e, a plurality of via conductors 6 may also be provided. The plurality of via conductors 6 may be provided immediately below the land electrodes of the resin sheet 81e so as to vertically penetrate through the resin sheet 81e.

The electronic component 3 may be, typically, a semiconductor component of CSP (Chip Size Package). On one surface of the electronic component 3, a plurality of pads 4 (see below) may be provided. An example of the semiconductor component of this type may be a memory with an encryption function which functions as a secure element IC. The other examples of the electronic component 3 may include Radio Frequency Integrated Circuit (RFIC) chips and image processor ICs for digital cameras. Note that the electronic component 3 may not be limited to the above-described semiconductor component of CSP. It may be MEMS (Micro Electro Mechanical Systems) or may be a passive component, such as a capacitor, a chip resistor, an inductor or the like.

The electronic component 3 may include upper and lower surfaces which are opposite to each other in the layer stacking direction (Z-axis direction) and side surfaces which are parallel to the layer stacking direction. In the present embodiment, a plurality of pads 4 may be provided on the lower surface. The plurality of pads 4 may include a first pad 4a and seconds pads 4b. The first pad 4a may reside inside the second pattern conductor 5a when viewed in plan in the layer stacking direction (Z-axis direction). This first pad 4a may be preferably a non-contact terminal (hereinafter, referred to as "NC terminal"). The NC terminal may be a terminal that may not be joined to any of the via conductors 6. The seconds pads 4b may be joined to the via conductors 6 provided in the resin sheet 81b and electrically coupled to the third pattern conductors 5b via the via conductors 6.

In many drawings (including FIG. 1 and FIG. 2), only the electronic component 3 and the plurality of pads 4 are shown for the purpose of simplifying the illustration, for example. The electronic component 3 and the pads 4 specifically have a configuration such as shown in FIG. 3. That is, a UBM (under-bump metal) 11 is provided on a Si substrate 10, and the periphery of the UBM 11 is covered with a $SiO_2$ layer 12. A polyimide layer 13 is provided on the $SiO_2$ layer 12. From the polyimide layer 13, pads 4 which are made of copper, or the like, are drawn out by a re-distribution layer while the pads 4 are in electrical conduction with the Si substrate 10.

The example of the configuration of the electronic component 3 that has been described above may include the UBM. However, the present invention is not limited to this example. For example, the re-distribution layer may be formed directly on the electrodes of the Si substrate 10.

Referring back to FIG. 1 and FIG. 2, the electronic component 3 and the plurality of pads 4 may be contained in the cavity C. The cavity C may be designed so as to have substantially the same size as the electronic component 3. More specifically, the electronic component 3 and the cavity C preferably may have such sizes that, when the electronic component 3 is contained in the cavity C, the side surfaces of the electronic component 3 may be in contact with the first resin layers 8c. It is also preferred that the lower surface and the side surfaces of the electronic component 3 may not be secured to the first resin layers 8c by a filler or the like. With this arrangement, even if the length in a certain direction of the layer 8c changes due to deformation of the mother substrate or the effects of environmental heat, the electronic component 3 may move inside the cavity C according to that change of the length. In other words, the electronic component 3 may slide over the resin sheet 81c of the first resin layers 8c. Note that, to improve the slidability of the electronic component 3 over the first resin layers 8c, it is further preferred that the surface of the electronic component 3 is mirror finished.

Examples of the electronic components 31 may include a RFIC chip for use in non-contact communication, and capacitor and inductor elements which may be constituents of a matching circuit or a filter circuit.

The plurality of pattern conductors 5 may, basically, be provided inside the multilayer substrate 2 and used as wiring conductors. When surface mount type electronic components 31 are mounted to the multilayer substrate 2 as in the present embodiment, pattern conductors 5 may also be provided as land electrodes on the surface of the multilayer substrate 2. Note that the pattern conductors 5 are not limited to the wiring conductors and the land electrodes but may be pattern conductors used for formation of capacitors or coils.

(Manufacturing Method of Module)

Next, a manufacturing method of the module 1 may be described with reference to FIG. 4A to FIG. 4E. In the following section, a manufacturing process of a single module 1 may be described, although in actuality large-surface resin sheets may be stacked up and cut, whereby a large quantity of modules 1 may be simultaneously manufactured.

First, a required number of large-surface resin sheets may be prepared, surfaces of which may generally be entirely covered with a copper foil. These large-surface resin sheets may include any of the resin layers 8 after completion of manufacturing of the module 1. To manufacture the module 1 of FIG. 1, large-surface resin sheets 91a to 91e (see FIG. 4A) corresponding to the resin sheets 81a to 81e may be prepared. The resin sheets 91a to 91e may consist of a liquid crystal polymer which has a thickness ranging from about 10 to about 100 μm. The thickness of the copper foil may range from about 6 to about 35 μm. Note that the surface of the copper foil may be preferably plated with zinc or the like so as to be flat for anticorrosion purposes.

Then, a plurality of external electrodes 7 may be formed by a photolithography process on one surface (e.g., lower surface) of at least one resin sheet 91a as shown in FIG. 4A. More specifically, firstly, a resist which has the same shape as the external electrodes 7 may be formed on the copper foil of the resin sheet 91a. Thereafter, etching is performed on the copper foil, whereby exposed part of the copper foil which is not covered with the resist may be removed. Thereafter, the resist may be removed. As a result, the external electrodes 7 consisting of copper may be formed on one surface of the resin sheet 91a.

By the photolithography process which is basically the same as that described above, the second pattern conductor 5a and the third pattern conductors 5b may be formed on one surface (e.g., lower surface) of the resin sheet 91b as shown in FIG. 4A. Note that the resin sheet 91b may become the resin sheet 81b of the second resin layer after completion of manufacture of the module 1.

By the photolithography process which is basically the same as that described above, the pattern conductors 5 are also formed on one surface (e.g., upper surface) of the large-surface resin sheets 91c to 91e as shown in FIG. 4A. Note that the large-surface resin sheets 91c to 91e may become the resin sheets 81c to 81e after completion of manufacture of the module 1.

Then, as shown in FIG. 4B, portions of the resin sheet 91a at which the via conductors 6 are to be formed may be irradiated with a laser beam supplied through a surface on which none of the external electrodes 7 is formed. As a result, via holes may be formed, and thereafter, an electrically-conductive paste may be supplied into the via holes to form the via conductors 6 in the resin sheet 91a.

Meanwhile, portions of the resin sheet 91b at which the via conductors 6 are to be formed may be irradiated with the laser beam supplied through a surface on which none of the second pattern conductor 5a and the third pattern conductors 5b is formed. Thereafter, an electrically-conductive paste may be supplied into the thus-formed via holes to form the via conductors 6 in the resin sheet 91b.

Likewise, predetermined portions of the resin sheets 91c to 91e may be irradiated with the laser beam supplied through a surface on which none of the pattern conductors 5 is formed. Thereafter, an electrically-conductive paste may be supplied into the thus-formed via holes to form the via conductors 6 in the resin sheets 91c to 91e.

Figure 4C:
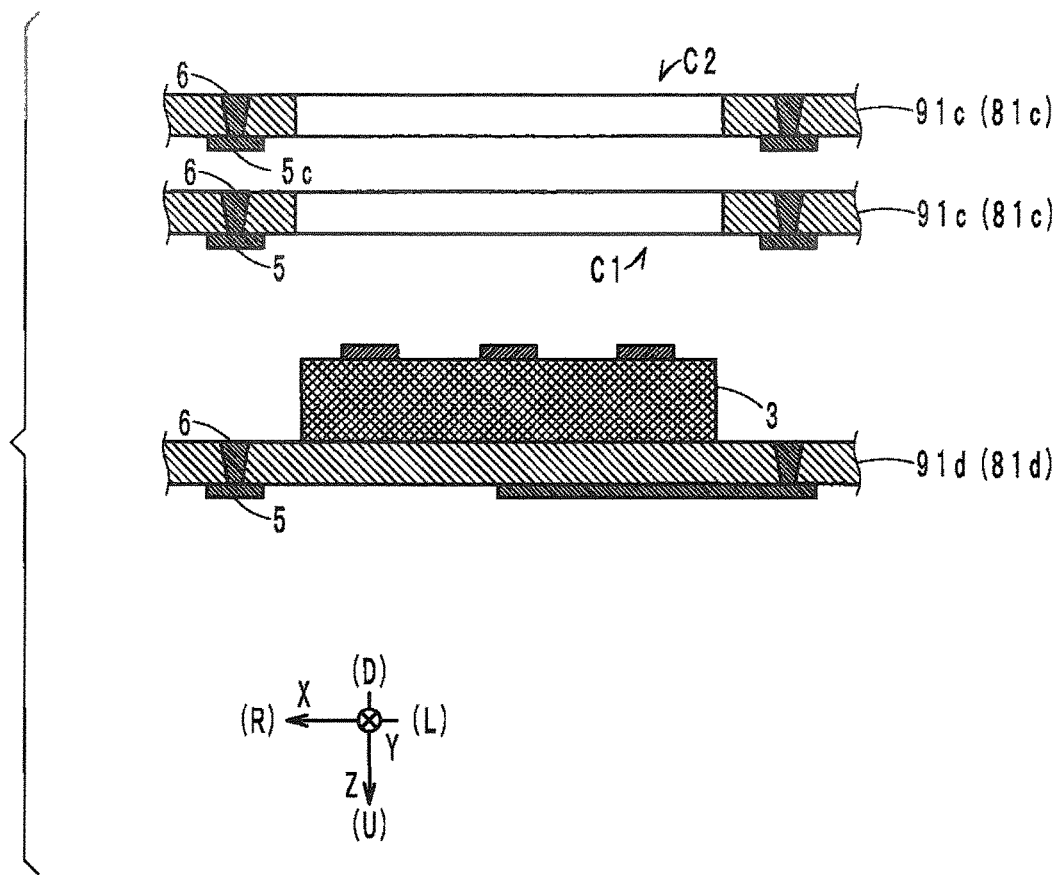
FIG. 4C is a schematic diagram illustrating a process following the process of FIG. 4B.

Then, as shown in FIG. 4C, the electronic component 3 may be placed on a surface of the resin sheet 91d on which the pattern conductor 5a is not provided and is subject to preliminary pressing. Thereby, the position of the electronic component 3 on the resin sheet 91d may be determined. Then, in each of the resin sheets 91c, a portion at which the electronic component 3 is to be placed may be stamped out using a die. Thereby, the through holes C1, C2 may be formed.

Then, the resin sheets 91a to 91e may be stacked up in this order from the bottom to the top as shown in FIG. 4D. It is noted that, in stacking of the sheets, a surface of the resin sheet 91a which has the external electrodes 7 may be oriented downward, and a surface of the resin sheet 91b which has the second pattern conductor 5a and the third pattern conductors 5b may be oriented downward, as will be described later.

Thereafter, heat and pressure may be applied to the stacked resin sheets 91a to 91e from both the top and the bottom of the stacked resin sheets. By this heating and compression process, the resin sheets 91a to 91e are softened and bonded together into a single structure, and the electrically-conductive paste in the via holes is solidified. As a result, the via conductors 6 are formed. Note that the resin sheets 91a to 91e may be bonded together using an adhesive agent of an epoxy resin, or the like, instead of compression bonding by heat and pressure.

Figure 4E:
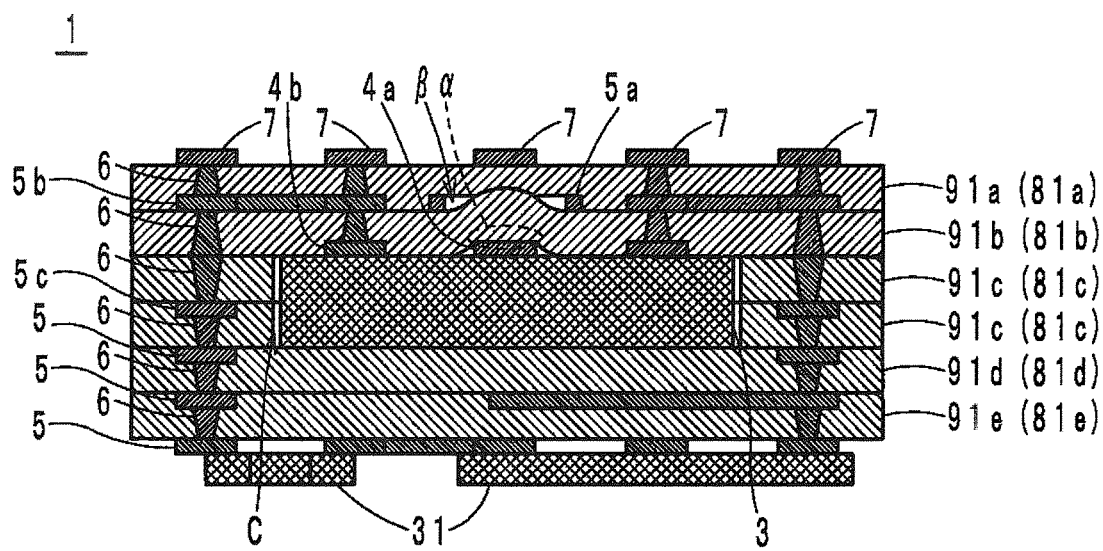
FIG. 4E is a schematic diagram illustrating a process following the process of FIG. 4D.
Figure 4E:
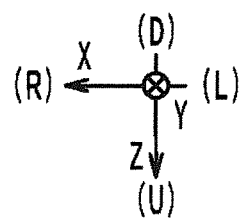

Lastly, the resin sheets 91a to 91e in the form of a single structure may be cut into pieces of a predetermined size. As a result, manufacture of the module 1 such as shown in FIG. 4E may be completed.

(Effects and Functions of First Pad and Second Pattern Conductor)

Figure 5A:
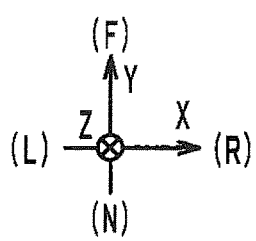
FIG. 5A is a top view of the electronic component of FIG. 1.
Figure 5A:
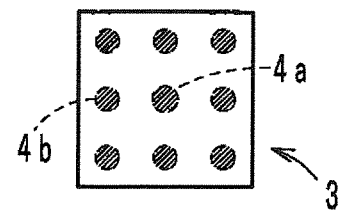
Figure 5B:
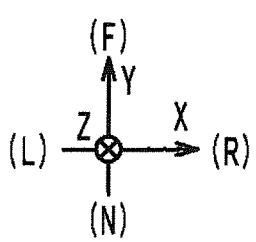
FIG. 5B is a top view of the second resin layer of FIG. 1.
Figure 5B:
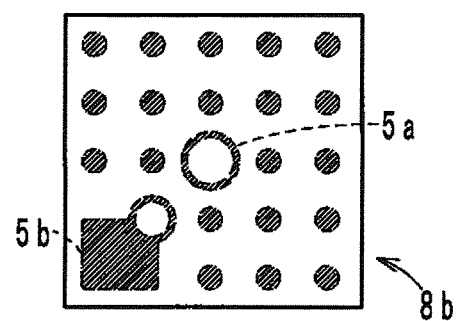
Figure 5C:
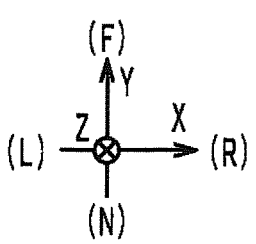
FIG. 5C is a schematic diagram showing the positional relationship over the XY plane between the first pad (NC terminal) of FIG. 4A and the second pattern conductor of FIG. 4B.
Figure 5C:
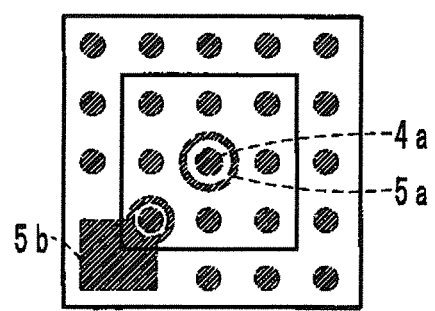
Figure 6B:
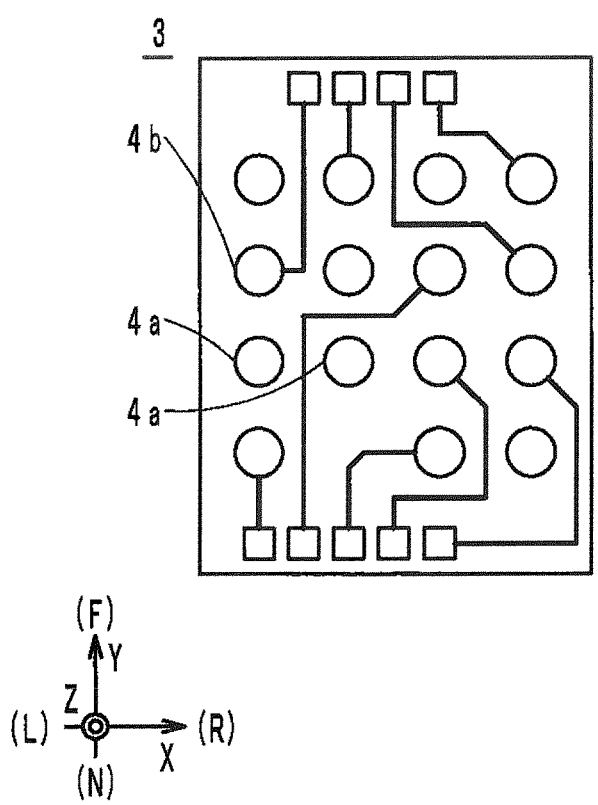
FIG. 6B is a top view of the electronic component of FIG. 6A.
Figure 6C:
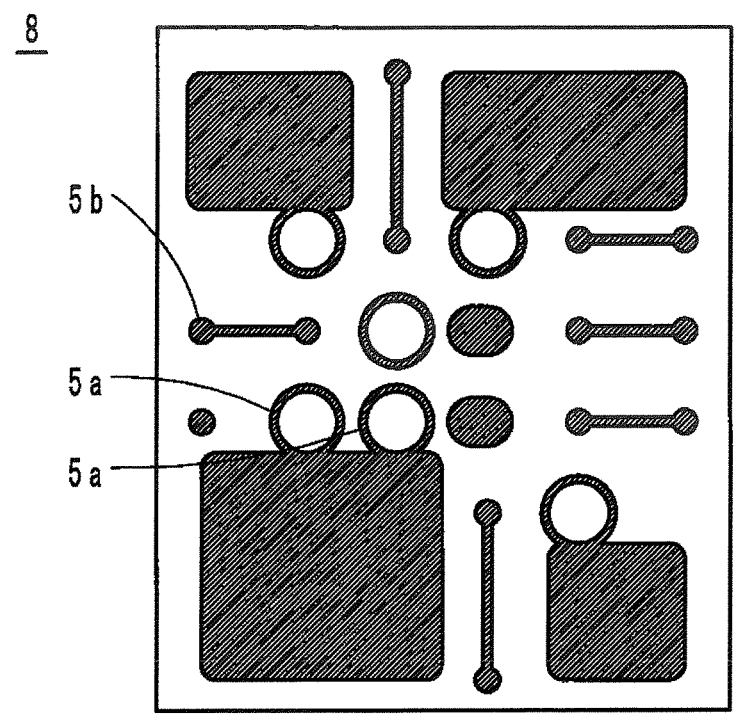
FIG. 6C is a top view of the second resin layer of FIG. 6A.
Figure 6C:
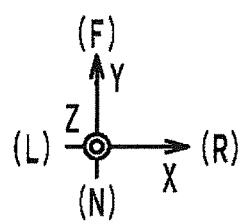
Figure 6D:
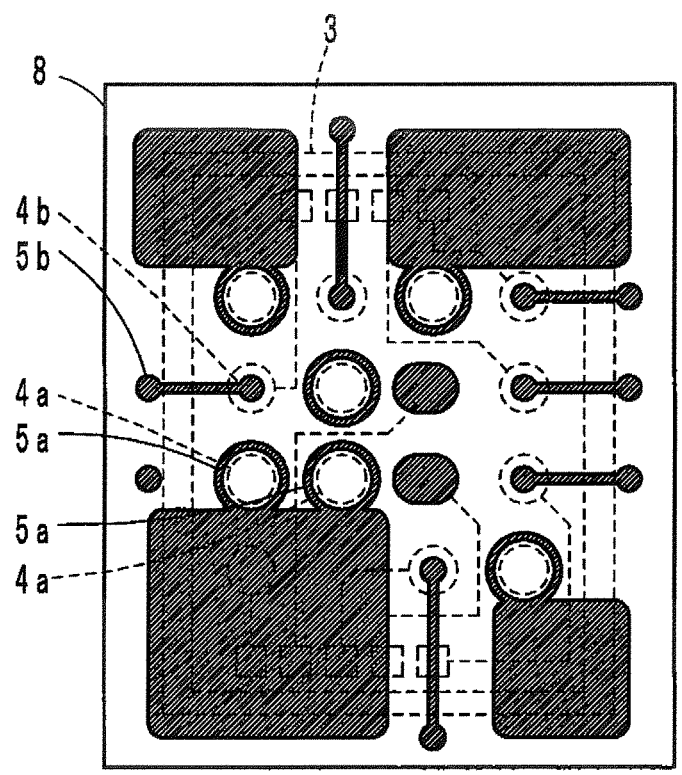
FIG. 6D is a schematic diagram showing the positional relationship over the XY plane between the first pad of FIG. 6B and the second pattern conductor of FIG. 6C.
Figure 6D:
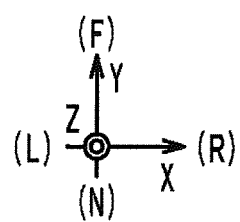

Next, the effects and functions of the first pad 4a and the second pattern conductor 5a may be described in detail. The first pad 4a may have a generally circular shape when viewed in plan in the layer stacking direction as shown in FIG. 5A. The first pad 4a may be provided at a position inwardly distant from the inner rim of the second pattern conductor 5a when viewed in plan in the layer stacking direction as shown in FIG. 5C. The second pattern conductor 5a may have an annular shape which may surround the entire circumference of the first pad 4a as shown in FIG. 5B. The second pattern conductor 5a may be arranged around the first pad 4a (described later) with a gap provided between the second pattern conductor 5a and the first pad 4a when viewed in plan in the layer stacking direction as shown in FIG. 5C.

The first pad 4a and the second pattern conductor 5a may be in the above-described positional relationship, and the flexible resin sheet 81b may be present between the first pad 4a and the second pattern conductor 5a. Therefore, when heating and compressing the plurality of stacked resin layers 8, a portion α of the resin sheet 81*b* abutting the first pad 4*a* may be received into a recess β formed inside the second pattern conductor 5*a* as shown in FIG. 4E. Thereafter, the resin sheet 81*b* may be cured. This resin portion thrust into the recess β may serve as an anchor and may be in close contact with the resin sheet 81*a* in the example of the present embodiment. As a result, the resin sheet 81*b* may have improved resistance to deformation by external force. Here, examples of the external force include mechanical shock and pressure caused by gas which can be produced inside the multilayer substrate 2. Due to improvement of this resistance, the bonding strength of the electronic component 3 and the resin sheet 81*b* (i.e., the multilayer substrate 2) may improve. Thus, even if the size of the bonding portion of the electronic component 3 and the multilayer substrate 2 decreases, improvement of the bonding strength can compensate for the decrease of the bonding strength which is attributed to size reduction.

Particularly when the electronic component 3 is embedded in the multilayer substrate 2, the multilayer substrate 2 may be compressed from both the top and the bottom during manufacturing, and therefore, the amount of the resin flowing into the recess β may be large, so that the bonding strength can be further improved.

As described above, a portion of the resin sheet 81*b* flowing into the recess β may be in close contact with the resin sheet 81*a* that is consisting of the same resin material as the resin sheet 81*b*. Here, since the first pad 4*a* is a NC terminal, the portion thrust into the recess β does not include the via conductors 6. That is, at the portion thrust into the recess β, there is no junction of different materials. Thus, the resin inside the recess β may be in strong contact with the resin sheet 81*a*.

(Other Examples of First Pad and Second Pattern Conductor)

In the above description of the first embodiment, the module 1 may include one first pad 4*a* and one second pattern conductor 5*a*. However, the present invention may not be limited to this example. The module 1 may include a plurality of sets of the first pad 4*a* and the second pattern conductor 5*a* as shown in FIG. 6A to FIG. 6D.

Figure 7:
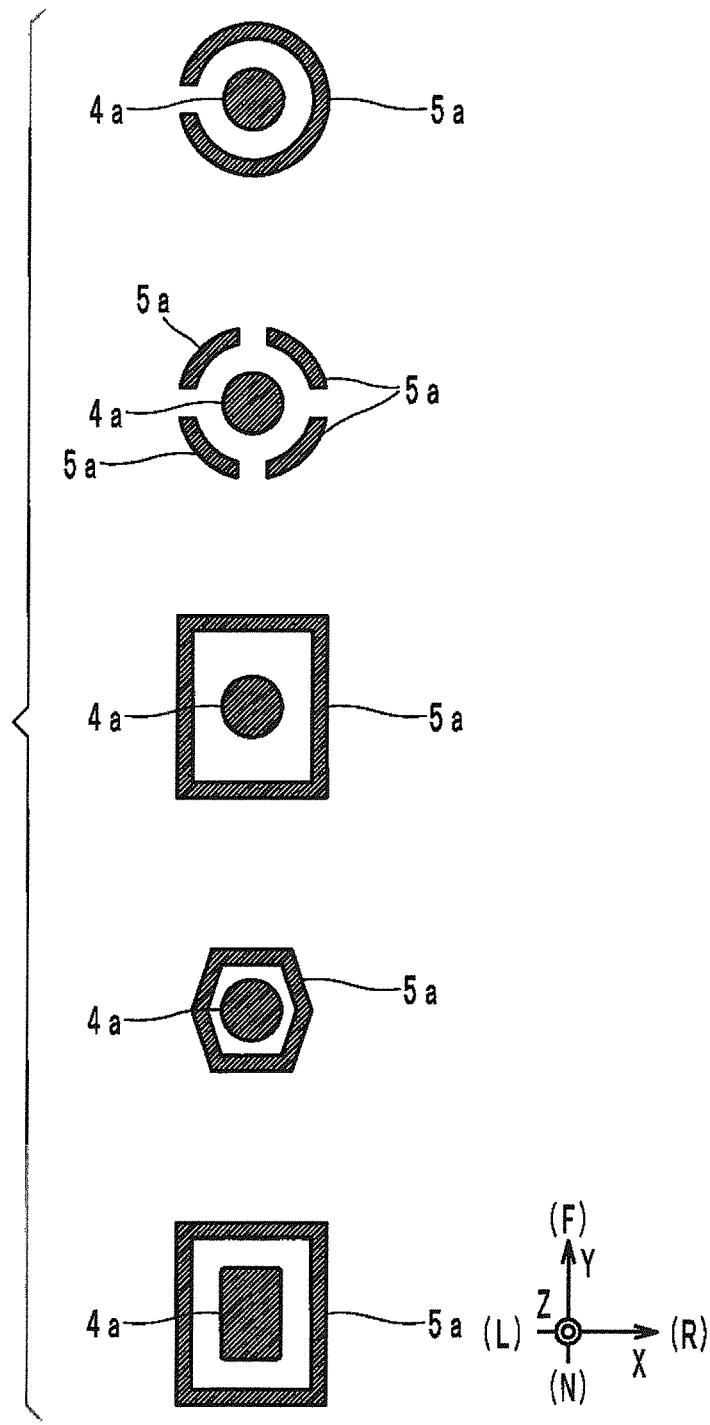
FIG. 7 is the first diagram showing other configuration examples of the first pad of FIG. 5A and the second pattern conductor of FIG. 5B.

In the above description of the first embodiment, the second pattern conductor 5*a* may include the annular shape when viewed in plan in the layer stacking direction. However, the present invention may not be limited to this example. As shown in the uppermost part of FIG. 7, the second pattern conductor 5*a* may have a partially cutaway annular shape (C shape) when viewed in plan in the layer stacking direction. Alternatively, as shown in the second part from the top of FIG. 7, the second pattern conductor 5*a* may have a shape formed by dividing an annulus into four equal parts. Still alternatively, the second pattern conductor 5*a* may not be limited to an annular shape but may have the shape of a rectangular or hexangular frame when viewed in plan in the layer stacking direction as shown in the third and fourth parts from the top of FIG. 7. Still alternatively, as shown in the lowermost part of FIG. 7, the first pad 4*a* may have a generally rectangular shape when viewed in plan in the layer stacking direction. It is noted that the first pad 4*a* and the second pattern conductor 5*a* may still be combined in different ways. For example, the second pattern conductor 5*a* with annular shape may be combined with the first pad 4*a* with rectangular shape.

As shown in the upper part of FIG. 8, when the space between adjacent pads 4*a* of the electronic component 3 is small, the second pattern conductor 5*a* may be arranged so as to surround the plurality of pads 4*a*. Alternatively, as shown in the lower part of FIG. 8, a wire may be stretched out from the first pad 4*a*.

Figure 9A:
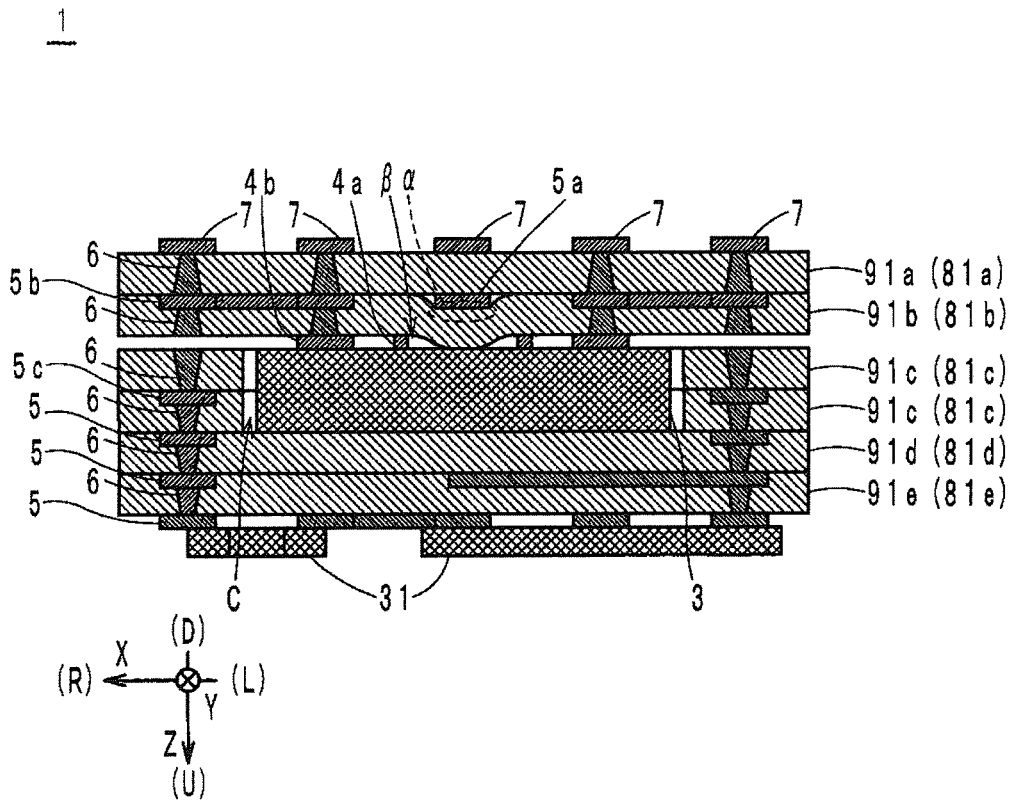
FIG. 9A is the third diagram showing another configuration example of the first pad of FIG. 5A and the second pattern conductor of FIG. 5B.

In the above description of the first embodiment, the first pad 4*a* may have a generally circular shape when viewed in plan in the layer stacking direction as shown in FIG. 5A, and the second pattern conductor 5*a* may have an annular shape which surrounds the entire circumference of the first pad 4*a* as shown in FIG. 5B. However, the present invention is not limited to this example. As shown in FIG. 9A, the second pattern conductor 5*a* may have a generally circular shape, and the first pad 4*a* may have such an annular shape that forms the recess β and surrounds the entire circumference of the second pattern conductor 5*a*. When heating and compressing the plurality of stacked resin layers 8, a portion α of the resin sheet 81*b* abutting the second pattern conductor 5*a* may be received into a recess β formed inside the first pad 4*a* as shown in FIG. 9A.

Figure 9B:
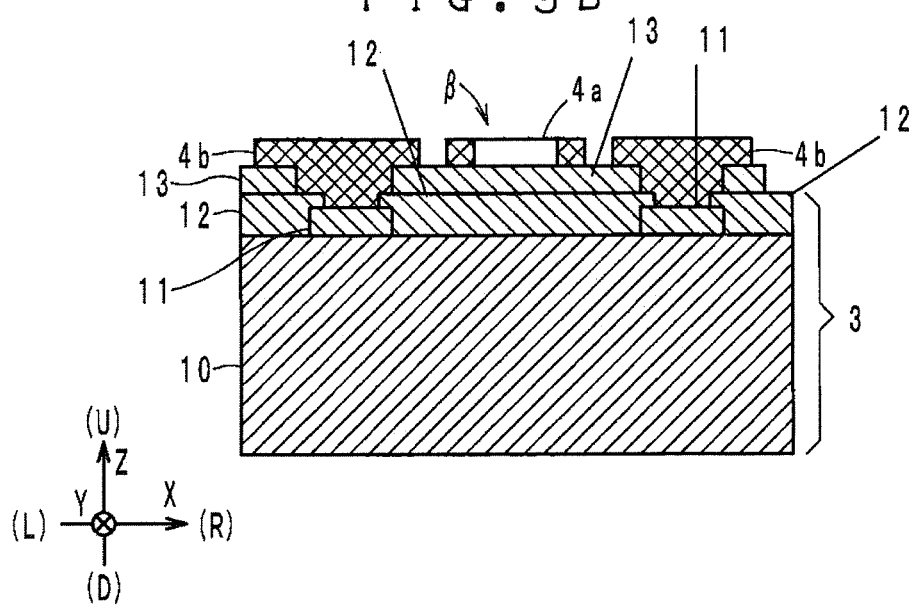
FIG. 9B is a diagram showing the first example of the configuration of a recess shown in FIG. 9A.

Note that, when the recess β is formed on the electronic component 3 side as described above, the recess β may be formed by an electrically-conductive material (i.e., first pad 4*a*) as shown in FIG. 9B, or the recess β may be formed by the $SiO_2$ layer 12, the polyimide layer 13 and the UBM 11 as shown in FIG. 9C.

(Practical Application Examples of Module)

Figure 10:
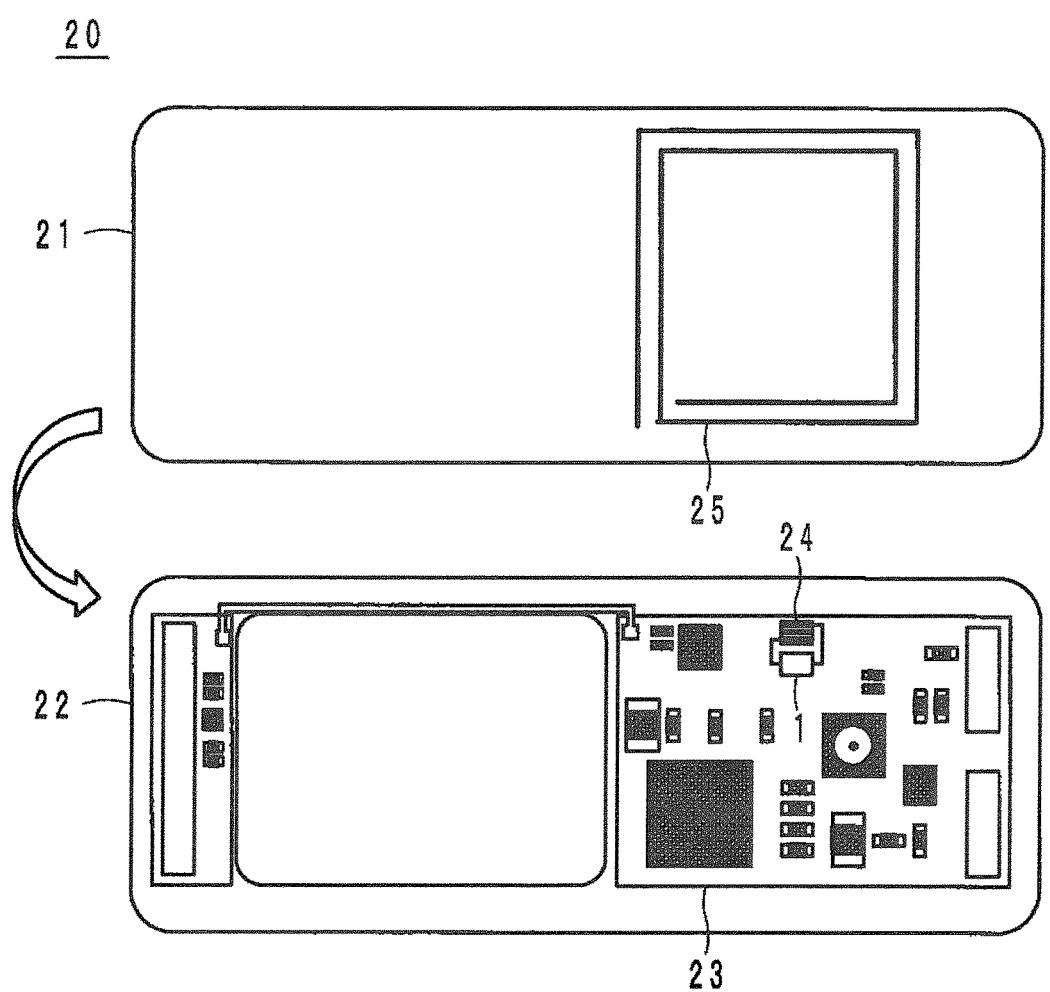
FIG. 10 is a schematic diagram showing a configuration of a communication terminal device including the module shown in FIG. 1.

The above-described module 1 may be used in, for example, a communication terminal device 20 which is compliant with the 13.56 MHz band NFC (Near Field Communication) as shown in FIG. 10. Here, FIG. 10 shows various components and members arranged in a casing 22 of the communication terminal device 20 when a casing cover 21 is removed. This communication terminal device 20 may typically be a cell phone or a smartphone. The other components provided inside the casing 22 other than the module 1 may include, for example, a printed wiring substrate 23, a coil antenna 24, and a booster antenna 25. Note that, inside the casing 22, there may be other components than those described above, including a battery pack, a camera unit, a UHF-band antenna, and various circuit elements, which may be mounted in a high density arrangement. However, these components do not constitute the major part of the present invention, and therefore, descriptions of these components are herein omitted.

Figure 11:
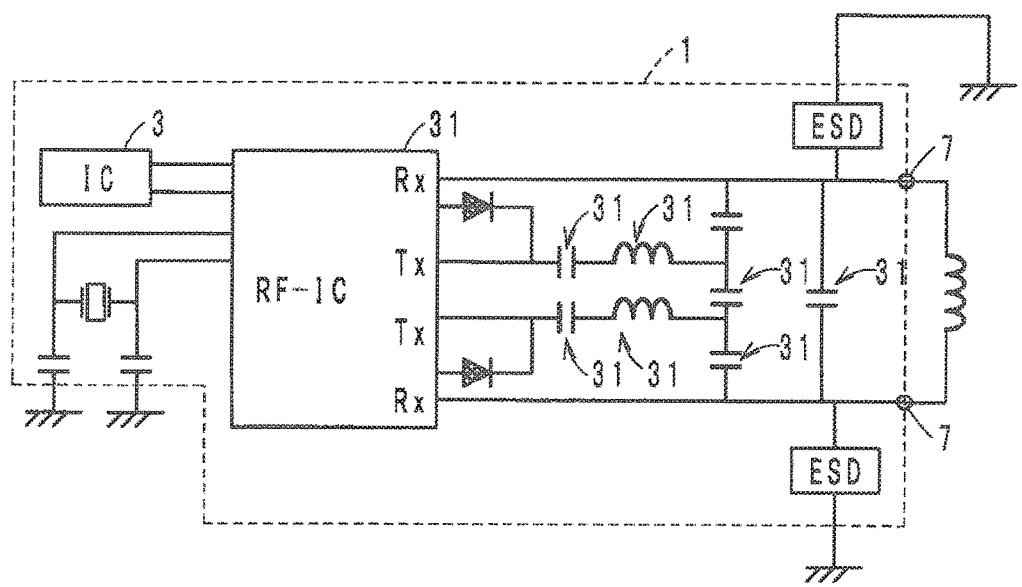
FIG. 11 is an equivalent circuit diagram of the major part of the communication terminal device shown in FIG. 10.

The coil antenna 24 may be mounted together with the module 1 to the printed wiring substrate 23. Further, as shown in the equivalent circuit of FIG. 11, the external electrodes 7 of the module 1 may be connected to both ends of the coil antenna 24.

The booster antenna 25 is attached to the casing cover 21 so as to face the coil antenna 24 when the casing cover 21 is closed. This booster antenna 25 is for example a planar spiral coil, or the like, and is provided for increasing the communication distance of the coil antenna 24.

As described above, a memory with an encryption function which is provided as the electronic component 3, and a RFIC chip, capacitor elements and inductor elements which may be provided as the electronic components 31 can be integrated into the module 1. This integration may reduce a transmission loss and unnecessary electromagnetic coupling which are attributed to routing of wires in the communication terminal device 20. Further, the space for mounting of the components can be reduced.

What is claimed is:

1. An electronic component-embedded module comprising:
    an electronic component having a plurality of pads on its surface; and
    a multilayer substrate which is a multilayer body formed by stacking up a plurality of resin layers and in which a cavity is formed for containing the electronic component,
    wherein the plurality of resin layers of the multilayer substrate at least includes:
        a first resin layer at which a plurality of first pattern conductors and a space, which forms the cavity, are formed, and
        a second resin layer having at least one second pattern conductor and a plurality of third pattern conductors, the plurality of third pattern conductors being capable of having electrical conduction with either of the plurality of first pattern conductors or the plurality of pads, the second resin layer being placed over the first resin layer,
    the plurality of pads include a first pad arranged around the second pattern conductor with a gap provided between the first pad and the second pattern conductor when viewed in plan in a layer stacking direction of the first resin layer and the second resin layer, wherein the gap is free of conductors, and
    a portion of the second resin layer is present between the second pattern conductor and the first pad.

2. The electronic component-embedded module of claim 1, wherein the portion of the second resin layer is received into a recess formed inside the first pad.

3. The electronic component-embedded module of claim 1, wherein the plurality of resin layers are bonded together using at least one of the adhesive agent and the compression bonding by heat and pressure.

4. The electronic component-embedded module according to claim 1, wherein the second pattern conductor overlaps the electronic component when viewed in plan in the layer stacking direction.

5. The electronic component-embedded module of claim 1, wherein the first pad is a non-contact terminal.

6. A communication terminal device comprising the electronic component-embedded module as set forth in claim 1.

* * * * *